United States Patent
Yates

(10) Patent No.: US 7,432,214 B2
(45) Date of Patent: Oct. 7, 2008

(54) COMPOSITIONS FOR DISSOLUTION OF LOW-K DIELECTRIC FILM, AND METHODS OF USE

(75) Inventor: Donald L Yates, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/889,280

(22) Filed: Jul. 12, 2004

(65) Prior Publication Data
US 2004/0248424 A1   Dec. 9, 2004

Related U.S. Application Data

(62) Division of application No. 09/652,991, filed on Aug. 31, 2000, now Pat. No. 6,762,132.

(51) Int. Cl.
*H01L 21/302* (2006.01)
(52) U.S. Cl. .................. 438/747; 438/750; 438/753; 438/756
(58) Field of Classification Search ................. 438/745, 438/747, 750, 753, 756
See application file for complete search history.

(56) References Cited

U.S. PATENT DOCUMENTS

| | | | |
|---|---|---|---|
| 3,839,111 A * | 10/1974 | Ham et al. ................... | 438/756 |
| 4,274,907 A | 6/1981 | Vig et al. | |
| 4,497,684 A | 2/1985 | Sebesta | |
| 4,508,591 A | 4/1985 | Bartlett et al. ................. | 216/47 |
| 4,989,063 A * | 1/1991 | Kolesar, Jr. ................... | 257/633 |
| 5,181,985 A | 1/1993 | Lampert et al. | |
| 5,202,572 A | 4/1993 | Kobayashi | |
| 5,300,463 A * | 4/1994 | Cathey et al. ............... | 438/703 |
| 5,366,912 A | 11/1994 | Kobayashi | |
| 5,536,602 A | 7/1996 | Nakao | |
| 5,571,447 A | 11/1996 | Ward et al. | |
| 5,622,787 A | 4/1997 | Sakata et al. | |
| 5,645,737 A * | 7/1997 | Robinson et al. ............ | 438/692 |
| 5,698,348 A | 12/1997 | Nakao | |
| 5,698,503 A | 12/1997 | Ward et al. | |

(Continued)

FOREIGN PATENT DOCUMENTS

EP   0 859 404 A2   8/1998

(Continued)

*Primary Examiner*—Binh X. Tran
(74) *Attorney, Agent, or Firm*—Whyte Hirschboeck Dudek SC

(57) ABSTRACT

An improved composition and method for cleaning the surface of a semiconductor wafer are provided. The composition can be used to selectively remove a low-k dielectric material such as silicon dioxide, a photoresist layer overlying a low-k dielectric layer, or both layers from the surface of a wafer. The composition is formulated according to the invention to provide a desired removal rate of the low-k dielectric and/or photoresist from the surface of the wafer. By varying the fluorine ion component, and the amounts of the fluorine ion component and acid, component, and controlling the pH, a composition can be formulated in order to achieve a desired low-k dielectric removal rate that ranges from slow and controlled at about 50 to about 1000 angstroms per minute, to a relatively rapid removal of low-k dielectric material at greater than about 1000 angstroms per minute. The composition can also be formulated to selectively remove a photoresist layer, leaving the underlying low-k dielectric layer essentially intact.

61 Claims, 3 Drawing Sheets

U.S. PATENT DOCUMENTS

| | | | |
|---|---|---|---|
| 5,702,849 A | 12/1997 | Sakata et al. | |
| 5,736,456 A * | 4/1998 | Akram | 438/614 |
| 5,817,549 A * | 10/1998 | Yamazaki et al. | 438/166 |
| 5,853,922 A | 12/1998 | Nakao | |
| 5,855,811 A | 1/1999 | Grieger et al. | |
| 5,858,625 A | 1/1999 | Nakao | |
| 5,928,969 A | 7/1999 | Li et al. | |
| 5,949,143 A | 9/1999 | Bang | 257/758 |
| 5,972,862 A | 10/1999 | Torii et al. | |
| 5,981,454 A | 11/1999 | Small | 510/175 |
| 6,044,851 A | 4/2000 | Grieger et al. | 134/1.3 |
| 6,057,583 A | 5/2000 | Gardner et al. | |
| 6,096,629 A | 8/2000 | Tsai et al. | |
| 6,147,002 A | 11/2000 | Kneer | |
| 6,162,739 A * | 12/2000 | Sumnitsch et al. | 438/745 |
| 6,163,061 A | 12/2000 | Iida | |
| 6,194,326 B1 | 2/2001 | Gilton | |
| 6,198,133 B1 | 3/2001 | Yamazaki et al. | 257/347 |
| 6,207,353 B1 | 3/2001 | Armacost et al. | |
| 6,211,527 B1 | 4/2001 | Chandler | |
| 6,217,416 B1 | 4/2001 | Kaufman et al. | |
| 6,221,786 B1 * | 4/2001 | Hsu et al. | 438/745 |
| 6,224,785 B1 | 5/2001 | Wojtczak et al. | 252/79.1 |
| 6,232,228 B1 | 5/2001 | Kwag et al. | 438/669 |
| 6,232,232 B1 | 5/2001 | Lee et al. | |
| 6,235,122 B1 | 5/2001 | Zhang et al. | |
| 6,235,693 B1 | 5/2001 | Cheng et al. | |
| 6,248,704 B1 | 6/2001 | Small et al. | |
| 6,249,021 B1 | 6/2001 | Furuhata | |
| 6,268,277 B1 | 7/2001 | Bang | |
| 6,277,507 B1 | 8/2001 | Anzaki et al. | 428/702 |
| 6,284,721 B1 * | 9/2001 | Lee | 510/175 |
| 6,303,047 B1 | 10/2001 | Aronowitz | |
| 6,309,926 B1 | 10/2001 | Bell et al. | 438/257 |
| 6,323,169 B1 | 11/2001 | Abe et al. | |
| 6,333,221 B1 | 12/2001 | Lee | |
| 6,340,435 B1 | 1/2002 | Bjorkman et al. | |
| 6,350,425 B2 | 2/2002 | Hoffman et al. | |
| 6,379,573 B1 | 4/2002 | Kim et al. | |
| 6,391,795 B1 | 5/2002 | Catabay et al. | |
| 6,413,583 B1 | 7/2002 | Moghadam et al. | |
| 6,453,924 B1 | 9/2002 | Wang et al. | |
| 6,492,731 B1 | 12/2002 | Catabay et al. | |
| 6,533,832 B2 | 3/2003 | Stechenrider et al. | |
| 6,541,369 B2 * | 4/2003 | Huang et al. | 438/624 |
| 6,585,910 B1 | 7/2003 | Kikuyama et al. | |
| 6,592,776 B1 | 7/2003 | Wang et al. | |
| 6,646,348 B1 | 11/2003 | Grumbine et al. | |
| 6,673,757 B1 | 1/2004 | Kneer | |
| 6,696,326 B2 | 2/2004 | Zhang et al. | |
| 6,703,319 B1 | 3/2004 | Yates et al. | |
| 6,756,674 B1 | 6/2004 | Catabay et al. | |
| 6,762,132 B1 | 7/2004 | Yates | |
| 6,844,345 B1 | 1/2005 | Hebeisen et al. | |
| 6,934,443 B2 | 8/2005 | Hikichi et al. | |
| 2001/0016408 A1 | 8/2001 | Famworth | |
| 2001/0051128 A1 | 12/2001 | Hoffman et al. | |
| 2002/0000673 A1 | 1/2002 | Famworth | |
| 2002/0052096 A1 | 5/2002 | Zhang et al. | |
| 2002/0081759 A1 | 6/2002 | Huang et al. | |
| 2002/0086513 A1 | 7/2002 | Famworth | |
| 2002/0104552 A1 | 8/2002 | Bay et al. | |
| 2002/0169613 A1 | 11/2002 | Hebeisen et al. | |
| 2002/0185749 A1 | 12/2002 | Famworth | |
| 2003/0081899 A1 | 5/2003 | Hikichi et al. | |
| 2003/0143807 A1 | 7/2003 | Chen et al. | |
| 2003/0194854 A1 | 10/2003 | Famworth | |
| 2004/0101988 A1 | 5/2004 | Roman et al. | |
| 2005/0032326 A1 | 2/2005 | Chen et al. | |

FOREIGN PATENT DOCUMENTS

| | | | |
|---|---|---|---|
| JP | 52108351 | | 9/1977 |
| JP | 358110078 | | 6/1983 |
| JP | 63113456 | A * | 5/1988 |
| JP | 03044646 | | 2/1991 |

* cited by examiner

COMPOSITIONS FOR DISSOLUTION OF LOW-K DIELECTRIC FILM, AND METHODS OF USE

CROSS-REFERENCE TO RELATED APPLICATIONS

This application is a division of U.S. patent application Ser. No. 09/652,991, filed Aug. 31, 2000, now U.S. Pat. No. 6,762,132.

FIELD OF THE INVENTION

The present invention relates to compositions and methods for their use in cleaning or etching of wafers used in the fabrication of semiconductor devices. More particularly, the invention relates to compositions for selectively removing low-k dielectric layers and/or photoresist layers on the wafers while controlling the rate of removal of the material, and methods using the compositions.

BACKGROUND OF THE INVENTION

Many semiconductor processes require wafer measurements to be made from time to time for production-line quality control, product stability, and conformance to specifications. Generally, the processing results are evaluated after each significant step. Since many tests are destructive or will harm the product wafer, the measurements are typically performed on a test or "dummy" wafer, which are blank wafers that are mixed in with the product wafers. Dummy wafers are specially prepared to have similar characteristics as the product wafers. Typically, a dummy wafer is made of silicon, although other alternative materials have been described. Since silicon wafers are expensive, when the processing and testing is completed, the dummy wafers are usually cleaned, inspected, and reused. In the recovery or recycling of dummy wafers, it is important to provide a clean surface for subsequent processing. In the recycling of dummy wafers used in a masking photoresist process, it is important to completely remove blanket films of oxide and resist layers from the surface of the wafer down to the bare silicon.

Wet chemical processing is conventionally used for cleaning the surfaces of wafers. The cleaning is performed in order to produce a wafer having a silicon surface that is hydrophobic and repels water as the wafer is pulled out of the bath. The wafers are then rinsed in deionized water, dried in heated nitrogen gas ($N_2$), and transferred to a processing operation, or stored.

Aqueous mixtures of hydrogen peroxide ($H_2O_2$) and sulfuric acid ($H_2SO_4$) are commonly used to strip or remove photoresist from a wafer surface after an etch processing step, or to remove a misaligned resist pattern from a wafer for re-imaging after development and inspection ("rework"). In such applications, it is desirable that the layer that is present under the resist, including, for example, silicon dioxide, remains intact on the wafer surface. In such cases, it is important to quickly remove the photoresist layer without attacking the underlying material. However, organic components in an underlying low-k dielectric layer, can alter the selectivity of the dielectric material to a resist layer.

In other applications, it is desirable to completely remove the oxide layer from a silicon surface. Hydrofluoric acid (HF) is conventionally used as a component of oxide etchants. HF solutions provide selective etch rates of about 100:1 or better for $SiO_2$:Si, and effectively etch away the oxide but not the underlying silicon wafer material. Prevalent HF solutions include, for example, a 1:10 mixture of 49% hydrofluoric acid (HF) and water, and a dilute 1:6 aqueous mixture of HF and ammonium fluoride ($NH_4F$). However, wet HF chemistries have difficulty removing low-k dielectrics such as a TMS-based low-k dielectric film, largely due to organic components in the oxide films. As a result, cleaning with an HF solution can leave the wafer with a gummy organic residue on the surface.

Therefore, it would be desirable to provide an improved composition for dissolution of low-k dielectric films from silicon-comprising surfaces. It would also be desirable to provide a cleaning composition that will completely remove low-k dielectric and photoresist components from the surface of a substrate such as a dummy wafer. It would also be desirable to provide a composition that can be modified to provide removal of a low-k dielectric material such as a TMS-based low-k dielectric film, from a wafer surface over a range of removal rates according to the application at hand.

SUMMARY OF THE INVENTION

The present invention provides a cleaning composition for use in wet cleaning or etching of a wafer surface, and a method of cleaning or etching wafer surfaces by applying the composition.

The cleaning composition is an aqueous solution that includes one or more effective amounts (v/v) of one or more fluorine-comprising compounds and one or more compatible acids to achieve the desired selectivity to resist and/or a low-k dielectric, and the desired rate of removal of the low-k material and/or the resist. A preferred composition according to the invention is an aqueous solution consisting essentially of the one or more fluorine-comprising compounds and the one or more acids.

The cleaning composition can be modified according to the invention to provide removal of a low-k dielectric material from the surface of a semiconductor wafer or other substrate over a range of removal rates according to the application at hand. In particular, the fluorine-comprising compound and the amount that is used, and also the amount of the acid component that is used, can be varied according to the invention to provide rapid removal of a low-k dielectric material and/or organic materials such as photoresist from the surface of the wafer at a rate of removal of greater than about 1000 angstroms per minute, or to provide controlled removal of either or both of those materials from the wafer surface at a slow to moderate rate of removal of about 50 to about 1000 angstroms per minute. The composition of the invention is useful in removing low-k dielectrics including, for example, trimethylsilane- and dimethylsilane-based low-k dielectrics.

For example, the composition can be formulated for use in a processing step such as a post-etch cleaning where it is desirable to remove low-k dielectric material at a slow and controlled rate so as to provide better process control. In that case, the cleaning composition is formulated with a relatively dilute concentration of the fluorine-comprising compound. By comparison, in a dummy recycling operation after a photoresist deposition or etching step, it is highly desirable to quickly and completely remove the low-k dielectric material and any photoresist or other organic components that may be present from the surface of the wafer, whereby the surface of the wafer is hydrophobic and water sheets off the surface of a wafer. In that case, a relatively high concentration of fluorine-comprising component is used in the composition. The composition can also be formulated to remove photoresist from a wafer, for example, after a mask operation, and leave the underlying low-k dielectric layer intact.

Suitable fluorine-comprising compounds are those that will speciate or ionize to provide fluoride ions at about pH 3 to 9. The fluorine-comprising compound can be an inorganic fluoride compound such as hydrofluoric acid (HF) and ammonium fluoride ($NH_4F$), or an organic fluoride compound such as tetramethylammonium fluoride and hydrogen fluoride pyridinium. Combined with the inorganic fluorine-comprising compound is an organic acid component that can be one or more of a monobasic, dibasic or tribasic organic acid, and is preferably citric acid, acetic acid, ascorbic acid, or mixtures thereof. An organic fluorine-comprising compound, when used, is combined with an inorganic acid such as sulfuric acid, among others. The acid component is included in an amount to control the pH of the composition at about 3 to about 9.

The invention also provides a method of cleaning a surface of a wafer. One embodiment of the method includes providing an aqueous cleaning composition that includes at least one fluorine-comprising compound and at least one acid component, and has a pH of about 3 to about 9; providing a wafer having a low-k dielectric layer and an overlying photoresist layer on at least one surface; and contacting the surface of the wafer having the low-k dielectric material and photoresist layers thereon with the cleaning solution under conditions effective to remove both of the low-k dielectric material and the photoresist layers substantially completely from the surface of the wafer, at a desired rate of removal whereby the resulting cleaned surface of the wafer is hydrophobic and water sheets off the surface of the wafer.

Another embodiment of the method includes providing an aqueous cleaning composition that includes at least one fluorine-comprising compound and at least one acid component and has a pH of about 3 to about 9; providing a wafer having a masked or unmasked low-k dielectric material on at least one surface; and contacting the surface of the wafer having the low-k dielectric material thereon with the cleaning solution under conditions effective to remove at least a portion of the low-k material at a desired rate of removal.

A further embodiment of the method includes providing an aqueous cleaning composition that includes at least one fluorine-comprising compound and at least one acid, and has a pH of about 3 to about 9; providing a wafer having a low-k dielectric layer and an overlying photoresist layer on at least one surface; and contacting the surface of the wafer having the low-k dielectric and photoresist layers thereon under conditions effective to remove the photoresist layer at a desired rate of removal while leaving the a low-k dielectric layer essentially intact.

BRIEF DESCRIPTION OF THE PREFERRED EMBODIMENTS

Preferred embodiments of the invention are described below with reference to the following accompanying drawings which are for illustrative purposes only. Throughout the following views, reference numerals will be used on the drawings, and the same reference numerals will be used throughout the several views and in the description to indicate same or like parts.

DETAILED DESCRIPTION OF THE PREFERRED EMBODIMENTS

Figure 1A:
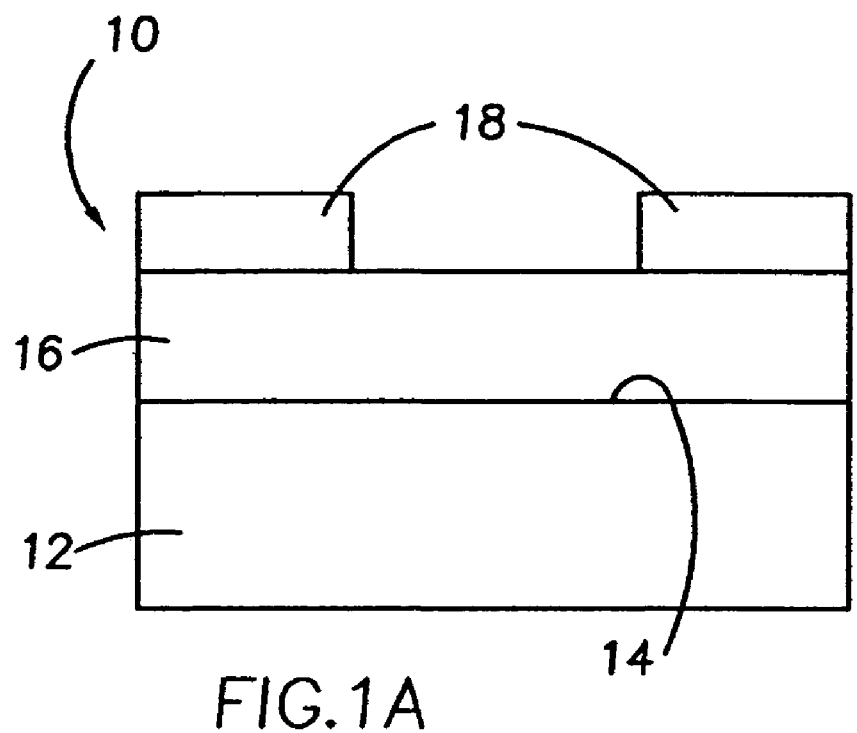
FIGS. 1A–1B are general illustrations of cross-section of a wafer having a layer of a low-k dielectric material and an overlying photoresist layer on a surface, before and after cleaning, respectively, to remove both layers from the surface of the wafer in accordance with one embodiment of the method of the present invention.

The invention provides improved cleaning of a wafer surface in the production of semiconductor wafers. Aqueous blends of at least one fluorinated compound and at least one compatible acid are provided that can be optimized by task for removal of low-k dielectric material and photoresist or other organic components from the surface of a wafer.

In accordance with the present invention, the compositions can be formulated to provide rapid removal of a low-k dielectric material, a controlled low to moderate rate of removal of a low-k dielectric material, removal of both resist and low-k dielectric materials, and/or removal of photoresist material with selectivity to low-k dielectric material. The blends are used for removal of a low-k dielectric layer and/or a layer of photoresist or other organic layer with selectivity to an underlying layer of a silicon substrate.

The fluorine-comprising compound which attacks the low-k dielectric material, is combined with an acid component that assists in the dissolution of the organic components. The pH of the cleaning composition is maintained at an appropriate level by the addition of an effective amount of the acid component to provide an environment for speciation of the fluorine-comprising compound to fluorine ions, and to achieve the desired etch selectivity. At a pH>9, free fluorine is available only as fluoride ions ($F^-$) which has little etching effect on silicon oxide material. At a pH<3, the available fluorine species are dominantly molecular, i.e., HF and $H_2F_2$. At an about pH 3.5, there is a mixture of species present. Preferably, the pH of the composition is maintained at a pH of about 3 to about 9 such that the ionic fluorine species dominates. By adjusting the pH, the dominant species of fluorine ($HF_2^-$) in the cleaning composition can be varied to adjust the etch rate on the low-k dielectric material.

Suitable fluorine-comprising compounds are those that speciate and release fluoride ions at a pH between about 3 to about 9. Examples of suitable fluorine-comprising compounds, i.e., include inorganic fluorines such as hydrofluoric acid (HF), ammonium fluoride ($NH_4F$), and mixtures thereof; and organic fluorines such as tetramethylammonium fluoride, hydrogen fluoride pyridinium, triethylamine trihydrofluoride, and other straight, branched, cyclic or aromatic derivatives, and mixtures thereof.

In the use of HF, $NH_4F$, or other inorganic fluorine-comprising compound, the acid component is an organic acid. Suitable organic acids include, but are not limited to monobasic acids such as formic, acetic, propionic, n-butyric, isobutyric, and benzoic acid; dibasic acids such as ascorbic, gluconic, malic, malonic, oxalic, succinic, and tartaric acids; tribasic acids such as citric and gallic acids; and mixtures thereof. In the use of an organic fluorine-comprising compound, a suitable inorganic acid is used, as for example, sulfuric acid, hydrochloric acid, nitric acid and phosphoric acid. The composition is typically in the form of a solution, and includes a solvent, preferably water, for dilution of the components.

The cleaning composition includes the fluorine-comprising compound and acid component in an amount effective to provide the desired selectivity and etch rate for removal of low-k dielectric material and/or a polymeric photoresist. Combinations of various inorganic/organic fluorine-comprising compounds and organic/inorganic acids according to the invention can be used for the desired results.

A first embodiment of a cleaning composition according to the invention and a method for its use in cleaning or etching the surface of a semiconductor wafer, is described with reference to FIGS. 1A–1B.

Figure 1B:
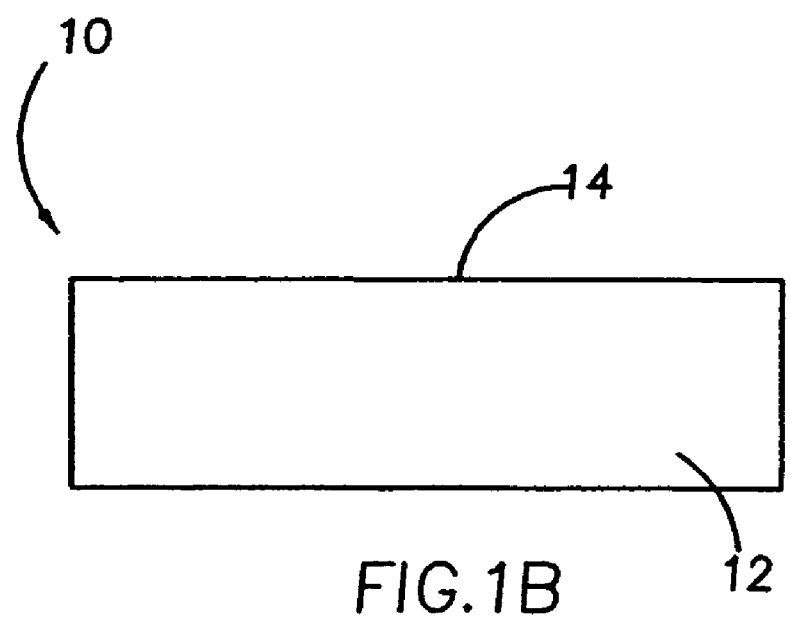

Referring to the figures, a portion of a wafer 10 is shown prior to cleaning (FIG. 1A) and after cleaning (FIG. 1B). The wafer 10 includes a substrate 12, for example, a silicon substrate, with a surface 14. A layer or film of a low-k dielectric material 16 overlies the surface 14 of the substrate 12. Overlying the low-k dielectric layer 12 are portions of an organic component 18 such as photoresist mask.

According to the invention, a cleaning composition can be formulated to provide complete removal of the photoresist layer 18 and low-k dielectric layer 16 from the surface 14 of the silicon substrate 12. FIG. 1B depicts the portion of the wafer 10 after cleaning, with the low-k dielectric layer 16 and the photoresist layer 18 having been completely removed by the cleaning process, resulting in a hydrophobic, oxide-free silicon surface 14.

The substantially complete removal of both a low-k dielectric material and a photoresist layer is particularly useful in the recycling of wafer dummies where it is desired to completely remove all low-k dielectric and organic materials including a photoresist layer from the wafer down to bare silicon to produce a clean surface that is hydrophobic (i.e., water sheets off the surface), for reuse of the wafer dummy in production.

A useful cleaning composition according to the invention for the substantially complete removal of a low-k dielectric material and a photoresist layer or other organic material from the surface of a silicon-comprising semiconductor wafer is an aqueous solution that includes an inorganic fluorine-comprising compound such as HF, $NH_4F$, and mixtures thereof, and an organic acid such as citric acid, among others.

An example of a preferred composition to remove substantially all of a low-k dielectric material and a layer of photoresist or other organic material from the surface of a wafer at a relatively low to moderate controlled rate of removal of about 50–1000 angstroms per minute to produce a hydrophobic wafer surface, comprises an aqueous solution of an about 1:2 (v/v) ratio of hydrofluoric acid (HF) and 50% citric acid and/or other organic acid, or about 30 to about 40% by volume of 49% HF and about 60 to about 70% by volume 50% citric acid and/or other organic acid, based on the total volume of the composition, with a pH of about 3 to about 4, to provide a relatively moderate rate of removal of the dielectric and photoresist layers at about 400 to about 600 angstroms per minute.

Another useful composition comprises an aqueous solution of an about 2:1 ratio (v/v) of 40% ammonium fluoride ($NH_4F$) and 50% citric acid and/or other organic acid, or about 60 to about 70% by volume of 40% $NH_4F$ and about 30 to about 40% by volume of 50% citric acid and/or other organic acid, based on the total volume of the composition, with a pH of about 4 to about 6, to provide a relatively low rate of removal of the low-k dielectric layer at about 50 to about 150 angstroms per minute, preferably about 100 angstroms per minute.

To provide rapid removal of low-k dielectric material at a rate greater than about 1000 angstroms per minute, preferably greater than about 2000 angstroms per minute, and minimal removal of a photoresist layer, a preferred composition is an aqueous solution of 49% hydrofluoric acid (HF) and 50% citric acid and/or other organic acid in a ratio (v/v) of about 2:1, or about 63 to about 70 percent by volume of 49% HF and about 30 to about 36 percent by volume of 50% citric acid and/or other organic acid, with a pH of about 2 to about 5, to generally achieve a removal rate of about 2300–2700 angstroms per minute. Another useful composition for a relatively low rate of removal of a low-k material comprises an aqueous solution of 40% ammonium fluoride ($NH_4F$) and 50% citric acid and/or other organic acid in a ratio (v/v) of about 2:1, or about 63 to about 70 percent by volume of 40% $NH_4F$ and about 30 to about 36 percent by volume of 50% citric acid and/or other organic acid, with a pH of about 3 to about 6.

A cleaning composition for substantially complete removal of both a low-k layer and photoresist layer can also be prepared with an organic fluoride such as hydrogen fluoride pyridinium combined with an inorganic acid such as sulfuric acid. A preferred composition comprises an about 1:5 ratio (v/v) of hydrogen fluoride pyridinium and 90% sulfuric acid ($H_2SO_4$), and/or other inorganic acid, or about 13 to about 19% by volume hydrogen fluoride pyridinium and about 80 to about 86% by volume of 90% $H_2SO_4$ and/or other inorganic acid, to provide a rapid rate of removal of the photoresist layer and a rate of removal of the dielectric layer at about 700 angstroms per minute.

Figure 2A:
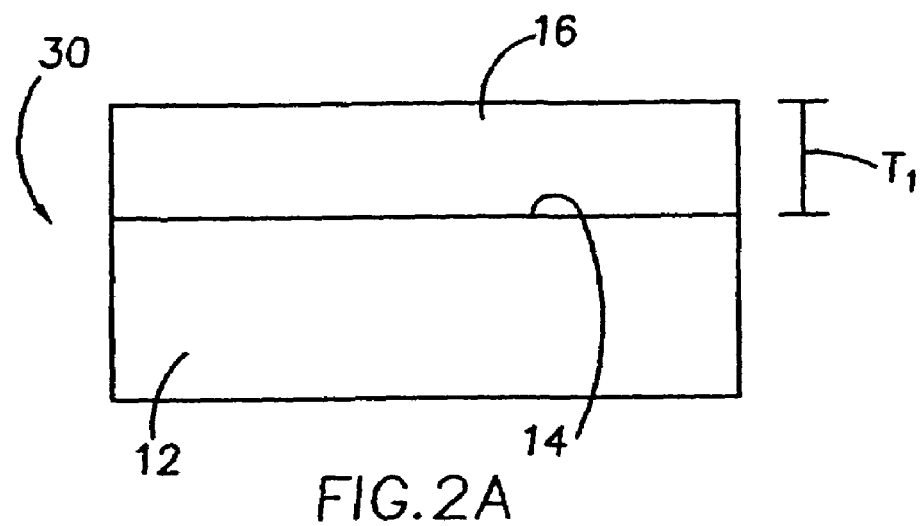
FIGS. 2A–2B are general illustrations of cross-section of a wafer having a layer of an unmasked low-k dielectric material on a surface, before and after cleaning, respectively, to remove the low-k dielectric layer in accordance with another embodiment of the method of the present invention.
Figure 2B:
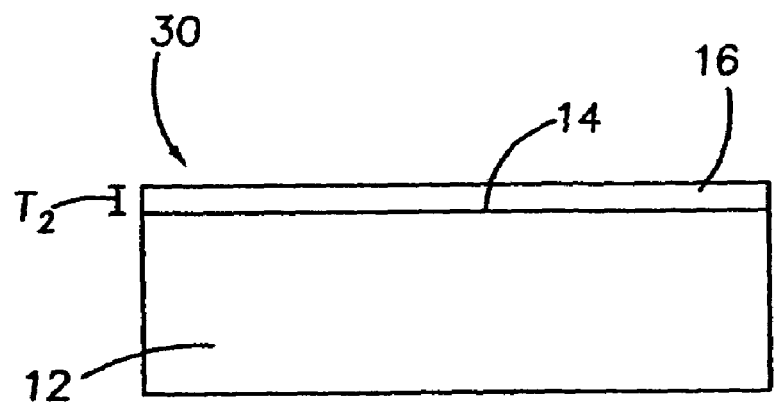

A second embodiment of a cleaning composition according to the invention, and a method for its use is described with reference to FIGS. 2A–2B. The wafer 30 to be cleaned includes a substrate 12, for example, a silicon substrate, and a surface 14. Overlying the surface 14 of the substrate 12 is an unmasked low-k dielectric film or layer 16 having a thickness $T_1$. According to the method, the cleaning composition is applied to the wafer 30 for removal of at least a portion of the low-k dielectric layer 16 from the surface 14 of the silicon-comprising substrate 12. FIG. 2B depicts the portion of the wafer 30 after cleaning. As depicted, the thickness $T_1$, of the low-k dielectric layer 16 has been reduced to thickness $T_2$ by the removal process. The low-k dielectric layer 16 can also be completely removed to produce a hydrophobic, oxide-free silicon surface 14 as depicted in FIG. 1B.

The foregoing cleaning compositions can be formulated according to the invention to provide removal of at least a portion of the low-k dielectric layer 16 from the surface of a semiconductor wafer at a rapid rate of removal (>1000 angstroms per minute) or a more controlled low to moderate rate of removal (about 50 to about 1000 angstroms per minute). A slow and controlled removal of low-k dielectric films is desirable in cases where removing the low-k dielectric material too quickly from the wafer leads to inadequate process control and causes difficulty in process integration. This is important when the objective is to remove small amounts of the low-k dielectric, such as from a silicon contact area. For example, in a post-etch cleaning, it is desirable to selectively remove a low-k dielectric material from a wafer at a slow and controlled rate in order to remove a small amount of the dielectric material from an etched feature and leave the bulk of the film intact. In that case, a preferred etchant composition is one that is formulated with a dilute HF ratio.

The compositions can be used to selectively remove all or a portion of a masked low-k dielectric layer while leaving the photoresist mask essentially intact. Such a composition is useful where wet patterning is required (rather than RIE). The composition is formulated to provide an etch selectively ratio of about 50:1 to about 1000:1 low-k dielectric:photoresist whereby the low-k dielectric material is selectively removed without attacking the photoresist or other organic material.

Figure 3A:
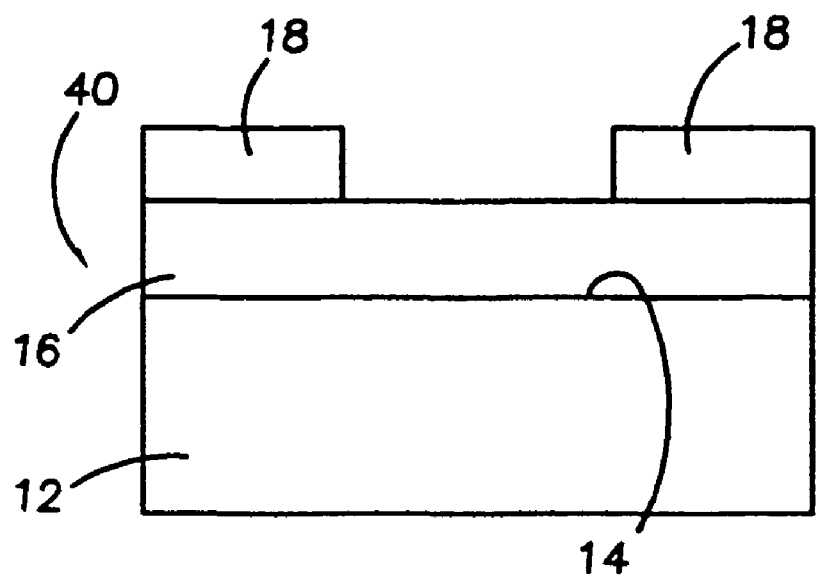
FIGS. 3A–3B are general illustrations of cross-section of a wafer having a layer of low-k dielectric material and an overlying photoresist layer on a surface, before and after cleaning, respectively, to remove the photoresist layer from the wafer in accordance with another embodiment of the method of the present invention.
Figure 3B:
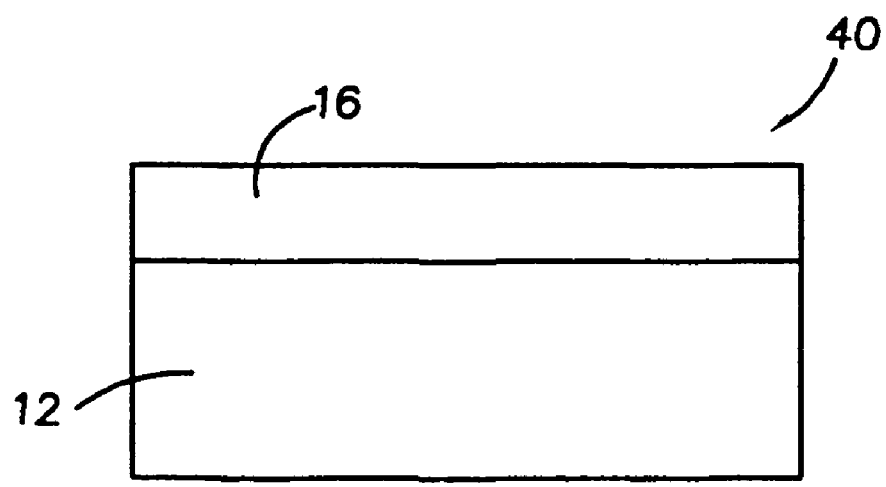

Another embodiment of a cleaning composition according to the invention, and a method for its use to remove photoresist from a wafer surface while leaving an underlying low-k dielectric layer essentially intact on the wafer surface, is described with reference to FIGS. 3A–3B. A portion of a wafer 40 is shown which includes a substrate 12, for example, a silicon substrate, with a surface 14. A layer or film of a low-k dielectric material 16 overlies the surface 14 of the substrate 12. Overlying the low-k dielectric layer 16 are portions of a photoresist mask 18. According to the method, a cleaning composition is applied to a wafer 40 to provide selective removal of substantially all of the photoresist mask layer 18, while leaving the underlying layer of low-k dielectric layer 16 essentially intact. FIG. 2B depicts the portion of the wafer 40 after cleaning, with the photoresist layer 18 having been completely removed by the cleaning process with the low-k dielectric material remaining on the wafer substrate 12.

This cleaning method is particularly useful for removing a photoresist layer after an etch processing step, or in a rework application to remove a misaligned resist mask. The composition is formulated to provide an etch selectivity ratio of about 200:1 photoresist:low-k dielectric in which the photoresist material is selectively removed at about 200 angstroms/minute without substantially attacking the low-k dielectric material, or a rate of removal of up to about 1 angstrom/minute.

A useful composition for the sole removal of a photoresist mask layer or other organic layer overlying a low-k dielectric layer comprises an aqueous solution of an inorganic fluorine-comprising compound and a major amount of an organic acid such as a 50% citric acid, with a pH of about 3 to about 4. A preferred composition comprises an about 1:100 (v/v) of an inorganic fluorine-comprising compound and an about 20 to about 60%, preferably about 40% to about 50%, aqueous solution of an organic acid. Preferably, the inorganic fluorine-comprising compound is included in an amount of up to about 2% by volume, preferably about 0.5% to about 1.5% by volume, and the organic acid is included in an amount of up to about 99.5% by volume, preferably about 98.5% to about 99.5% by volume, based on the total volume of the composition, with a pH of about 3 to about 3.5. A preferred composition comprises an about 1:100 ratio of 49% HF and 50% citric acid and/or other organic acid, which provides a rate of removal of the photoresist layer at about 400–600 angstroms per minute with an etch selectivity for a polymeric photoresist material material of at least about 200:1.

To clean a wafer surface according to the invention, the wafer is placed in contact with an appropriately formulated cleaning composition to remove the desired layer or layers at a desired rate of removal. The cleaning composition can be applied using a conventional wet chemical application technique as known and used in the art. For example, one or more wafers can be placed vertically in a carrier or boat and then submerged in a recirculating bath of the cleaning composition, with or without agitation for about 5–10 minutes, depending on the thickness of the layer to be removed. The cleaning composition can also be sprayed onto the surface of the wafer. Preferably, a substantially constant concentration of the reactive components of the cleaning composition is brought into contact with the wafer surface so that a uniform rate of removal can be maintained to allow for process uniformity and the desired extent and completeness of removal.

In the cleaning of a wafer, the cleaning composition can be used at a temperature of about 15° C. to about 30° C., preferably at about 15° C. to about 30° C. High temperatures of about 40 to about 60° C. can be typically used to achieve faster etch rates. In a selective removal of a photoresist mask or other organic material and not a low-k dielectric layer, it is preferred that lower temperatures of about 15° C. to about 30° C. are used to improve the selectivity of the low-k dielectric material over the photoresist.

Depending on the composition of the cleaning composition, other selective etch ratios/rates are within the scope of the present invention. The selectivity and removal time can be adjusted and controlled by varying the concentrations of the fluorine-comprising compound and the acid component, as further illustrated in the examples. The selectivities vary as the v/v ranges increase and decrease. Generally, a composition formulated to comprise a major amount of HF will provide a high etch of the low-k dielectric material selective to the resist. With a major amount of the acid component and a lower content of the fluorine-comprising compound, good removal of the resist selective to the low-k dielectric material will be achieved.

The following examples are given to illustrate specific preferred embodiments of the present invention. Numerous other variations, however, are within the scope of the present invention.

EXAMPLE

This example studies the effect of varying the fluorine-comprising component (49% HF or 40% NH$_4$F), and the v/v ratios of the fluorine-comprising component and the acid component (50% citric acid) on the rate of removal of a low-k dielectric and a photoresist layer (OIR 897-10I) from a silicon wafer surface.

TABLE 1

| Run # | Fluorine component | Parts (v) | Acid Component | Parts (v) | Low-k removal rate (Å/min.) | Photoresist Removal |
|---|---|---|---|---|---|---|
| 1 | 49% HF | 100 | — | — | [a]negligible | [a]negligible |
| 2 | 49% HF | 100 | — | — | [b]negligible | [b]negligible |
| 3 | 40% NH$_4$F | 2 | 50% citric acid | 1 | 100 | negligible |
| 4 | 49% HF | 2 | 50% citric acid | 1 | 2500 | negligible |
| 5 | 49% HF | 1 | 50% citric acid | 2 | 500 | complete |
| 6 | 49% HF | 1 | 50% citric acid | 100 | Negligible | complete |
| 7[c] | Hydrogen fluorine pyridinium (anhydride) | 1 | 90% sulfuric acid | 5 | Complete (700) | Complete |

[a]Repeated acid/water dips over 30 minutes, produced non-uniform flaking without dissolution of the low-k dielectric or photoresist.
[b]A single, prolonged immersion (20+ minutes) showed little or no effect on removal of the low-k or 10i photoresist.
[c]The wafer surface had a 3000 angstrom layer of trimethylsilane (TMS) only (no photoresist layer).

The surface of the wafers had a layer of chemical vapor deposited (CVD) trimethylsilane-based low-k dielectric film (TMS delivered in H$_2$ and N$_2$O) about 3000 angstroms thick, and an overlying layer of photoresist. The wafers were immersed in a beaker of the cleaning solution. Run Nos. 3–6 were immersed in solution for multiple tests, from 30 seconds to 4 minutes. The low-k dielectric removal rates were determined by using a UV1250 spectroscopic ellipsometer.

The results show that changing the fluorine-comprising component, and varying the amounts of the fluorine and acid components alters the rate of removal of a layer of low-k from the wafer surface.

The results of Run Nos. 1–2 show that HF used alone was ineffective in removing dielectric and photoresist material from the wafer surface. The use of HF alone resulted in pieces of the TMS-based low-k dielectric film and photoresist flaking off and floating on the surface of the cleaning solution, without significant dissolution.

The results of Runs 3 and 4 show the effect of varying the inorganic fluorine component that is used on the rate of removal of the TMS-based low-k dielectric layer. A 2:1 of $NH_4F$:citric acid provided a low-k dielectric removal rate of about 100 angstroms per minute, while a 2:1 of HF:citric acid provided a low-k dielectric removal rate of about 2500 angstroms per minute.

The results of Run Nos. 4–6 show the effect of varying the weight ratio of the organic acid (50% citric acid) and the fluorine component (HF) on the rate of removal of the TMS-based low-k dielectric film and a polymeric photoresist mask layer from the surface of the wafer. A 1:100 HF:citric acid ratio resulted in complete removal of the photoresist while leaving the low-k layer intact on the surface of the wafer. A 1:2 HF:citric acid ratio resulted in complete removal of both the photoresist and the TMS-based low-k dielectric film layers, with a moderate rate of removal of the low-k layer at about 500 angstroms per minute. A 2:1 ratio of HF:citric acid ratio resulted in rapid removal of TMS-based low-k dielectric film at about 2500 angstroms per minute, and negligible removal of photoresist.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents. The disclosure of cited patents are incorporated by reference herein.

What is claimed is:

1. A method for removing a low-k dielectric layer and organic material from a substrate, comprising contacting the dielectric layer and the organic material with an aqueous solution comprising hydrofluoric acid and an organic acid in a ratio of about 1:2 (v/v), such that the dielectric layer and the organic material are removed from the substrate at a rate of about 50 to about 1000 angstroms per minute.

2. A method for removing a dielectric layer and organic material from a substrate, comprising contacting the dielectric layer and the organic material with an aqueous solution comprising at least hydrofluoric acid and one or more organic acids in a ratio of about 1:2 (v/v), such that the dielectric layer and the organic material is removed at a rate of about 400 to about 600 angstroms per minute.

3. A method of cleaning a surface of a wafer, comprising contacting the wafer with an aqueous solution comprising hydrofluoric acid and an organic acid in a ratio of about 1:2 (v/v) to remove dielectric material and photoresist material at a rate of about 50 to about 1000 angstroms per minute.

4. The method of claim 3, wherein the dielectric material and the photoresist material are removed at a rate of about 400 to about 600 angstroms per minute.

5. A post-etch cleaning to remove a low-k dielectric material and photoresist material from a wafer, comprising treating a wafer to remove at least a portion of a dielectric layer and an overlying photoresist layer by applying an aqueous solution of a least one inorganic fluorine-comprising compound and at least one organic acid in a ratio of about 1:2 (v/v), the solution having a pH of about 3 to about 4, such that the removal rate of the low-k dielectric material and the photoresist is controlled at about 50 to about 1000 angstroms per minute.

6. A method of cleaning wafer surfaces, comprising
contacting low-k dielectric material and organic material on a wafer with an aqueous solution under conditions effective to remove at least a portion of the low-k dielectric material and the organic material at a rate of about 50 to about 1000 angstroms per minute, the aqueous solution comprising at least one inorganic fluorine-comprising compound and at least one organic acid in a ratio of about 1:2 (v/v), the inorganic fluorine comprising compound selected from the group consisting of hydrofluoric acid and ammonium fluoride, and mixtures thereof; and the organic acid selected from the group consisting of citric acid, acetic acid, ascorbic acid, and mixtures thereof.

7. The method of claim 6, wherein the aqueous solution comprises about 30% to about 40% by volume of the fluorine-comprising compound, and about 60% to about 70% by volume of the organic acid, based on the total volume of the solution.

8. The method of claim 6, wherein contacting the low-k dielectric material comprises immersing the wafer in a bath of the composition, spraying the surface of the wafer with the composition, exposing the wafer to a vapor, or any combination thereof.

9. The method of claim 6, wherein the aqueous solution comprises at least hydrofluoric acid and at least one organic acid in a ratio of about 1:2 (v/v), to remove at least a portion of the low-k material at a rate of about 400 to about 600 angstroms per minute.

10. The method of claim 9, wherein the aqueous solution comprises about 30 to about 40% by volume of hydrofluoric acid, and about 60 to about 70% by volume of the organic acid.

11. A method of cleaning wafer surfaces, comprising:
contacting a wafer having low-k dielectric material and photoresist material thereon with an aqueous composition under conditions effective to remove at least a portion of the low-k dielectric material and photoresist material at a rate of about 50-1000 angstroms per minute, the composition consisting essentially of one or more inorganic fluorine-comprising compounds and one or more organic acids in a ratio of about 1:2 (v/v), and having a pH of about 3-4.

12. The method of claim 11, wherein the inorganic fluorine-comprising compound is selected from the group consisting of hydrofluoric acid, ammonium fluoride, and mixtures thereof; and the organic acid is selected from the group consisting of citric acid, acetic acid, ascorbic acid, and mixtures thereof.

13. The method of claim 11, wherein the composition is formulated to remove the dielectric layer at a rate of about 400 to about 600 angstroms per minute.

14. The method of claim 11, wherein at least a portion of the low-k dielectric layer is unmasked.

15. The method of claim 11, wherein at least a portion of the low-k dielectric layer is masked by an overlying layer of the photoresist material.

16. The method of claim 11, wherein the composition is formulated to remove the dielectric layer and the photoresist layer from the surface of the wafer, such that the surface of the substrate is rendered substantially hydrophobic.

17. A method for treating a surface of a substrate, comprising contacting the substrate with an aqueous solution comprising an about 1:2 (v/v) ratio of an inorganic fluorine compound and an organic acid, to remove at least a portion of dielectric and organic material from the surface of the substrate at a rate of about 50-1000 angstroms per minute.

18. The method of claim 17, wherein the inorganic fluorine compound comprises hydrofluoric acid.

19. The method of claim 17, wherein the organic acid is selected from the group consisting of citric acid, acetic acid, ascorbic acid, and mixtures thereof.

20. The method of claim 17, wherein the organic material layer comprises a photoresist material.

21. The method of claim 17, wherein the dielectric material comprises a trimethylsilane low k dielectric.

22. The method of claim 17, wherein the dielectric material comprises a dimethylsilane low-k dielectric.

23. A method for treating a surface of a substrate, comprising contacting the substrate with an aqueous solution comprising an about 1:2 (v/v) ratio of an inorganic fluorine compound and an organic acid, with a pH of about 3-4, to remove at least a portion of dielectric and organic material from the substrate at a rate of about 50-1000 angstroms per minute.

24. A method for treating a surface of a substrate, comprising contacting the substrate with an aqueous solution comprising an about 1:2 (v/v) ratio of an inorganic fluorine compound and an organic acid to remove at least a portion of dielectric and organic material from the substrate at a rate of about 400-600 angstroms per minute.

25. A method for treating a surface of a substrate, comprising contacting the substrate with an aqueous solution comprising an about 1:2 (v/v) ratio of an inorganic fluorine compound and an organic acid, to remove substantially all dielectric and organic material from the substrate at a rate of about 50-1000 angstroms per minute.

26. A method for treating a surface of a substrate, comprising contacting the substrate with an aqueous solution comprising an about 1:2 (v/v) ratio of an inorganic fluorine compound and an organic acid, to remove substantially all of dielectric and organic material from the substrate at a rate of about 400-600 angstroms per minute.

27. A method for treating a surface of a substrate, comprising contacting the substrate with an aqueous solution comprising an about 1:2 (v/v) ratio of hydrofluoric acid and organic acid, to remove at least a portion of dielectric and organic material from the substrate at a rate of about 50-000 angstroms per minute.

28. A method for treating a surface of a substrate, comprising contacting the substrate with an aqueous solution comprising an about 1:2 (v/v) ratio of hydrofluoric acid and organic acid, with a pH of about 3-4, to remove at least a portion of dielectric and organic material from the substrate at a rate of about 50-1000 angstroms per minute.

29. A method for treating a surface of a substrate, comprising contacting the substrate with an aqueous solution comprising an about 1:2 (v/v) ratio of hydrofluoric acid and organic acid to remove at least a portion of dielectric and organic material from the substrate at a rate of about 400-600 angstroms per minute.

30. A method for treating a surface of a substrate, comprising contacting the substrate with an aqueous solution comprising an about 1:2 (v/v) ratio of hydrofluoric acid and organic acid, to remove substantially all of dielectric and organic material from the surface of the substrate at a rate of about 50-1000 angstroms per minute.

31. A method for treating a surface of a substrate, comprising contacting the substrate with an aqueous solution comprising an about 1:2 (v/v) ratio of hydrofluoric acid and organic acid, to remove substantially all dielectric and organic material layer from the substrate at a rate of about 400-600 angstroms per minute.

32. A method for treating a surface of a substrate, comprising contacting the substrate with an aqueous solution comprising an about 1:2 (v/v) ratio of inorganic fluorine compound and organic acid, to remove substantially all dielectric and organic material from the surface of the substrate at a rate of about 50-1000 angstroms per minute to produce a hydrophobic, oxide-free surface.

33. A method for treating a surface of a substrate, comprising contacting the substrate with an aqueous solution comprising an about 1:2 (v/v) ratio of an inorganic fluorine compound and an organic acid, to remove substantially all dielectric and organic material from the surface of the substrate at a rate of about 400-600 angstroms per minute to produce a hydrophobic, oxide-free surface.

34. A method for treating a surface of a substrate, comprising contacting the substrate with an aqueous solution comprising an about 1:2 (v/v) ratio of hydrofluoric acid and organic acid, to remove substantially all dielectric and organic material from the surface of the substrate at a rate of about 50-1000 angstroms per minute to produce a hydrophobic, oxide-free surface.

35. A method for treating a surface of a substrate, comprising contacting the substrate with an aqueous solution comprising an about 1:2 (v/v) ratio of hydrofluoric acid and organic acid, to remove substantially all dielectric and organic material from the surface of the substrate at a rate of about 400-600 angstroms per minute to produce a hydrophobic, oxide-free surface.

36. A method for treating a surface of a silicon substrate, comprising contacting the silicon substrate with an aqueous solution comprising an about 1:2 (v/v) ratio of an inorganic fluorine compound and an organic acid, to remove substantially all dielectric and organic material from the surface of the silicon substrate at a rate of about 400-600 angstroms per minute to produce a hydrophobic, oxide-free silicon surface.

37. A method for treating a surface of a substrate, comprising contacting the substrate with an aqueous solution comprising about 30-40% by volume hydrofluoric acid and about 60-70% by volume organic acid, based on the total volume of the composition, to remove at least a portion of dielectric and organic material from the substrate at a rate of about 50-1000 angstroms per minute.

38. A method for treating a surface of a substrate, comprising contacting the substrate with an aqueous solution comprising about 30-40% by volume hydrofluoric acid and about 60-70% by volume organic acid, based on the total volume of the composition, to remove at least a portion of dielectric and organic material from the substrate at a rate of about 400-600 angstroms per minute.

39. A method for treating a surface of a substrate, comprising contacting the substrate with an aqueous solution comprising about 30-40% by volume hydrofluoric acid and about 60-70% by volume organic acid, based on the total volume of the composition, to remove substantially all dielectric and organic material from the substrate at a rate of about 50-1000 angstroms per minute.

40. A method for treating a surface of a substrate, comprising contacting the substrate with an aqueous solution comprising about 30-40% by volume hydrofluoric acid and about 60-70% by volume organic acid, based on the total volume of the composition, to remove substantially all dielectric and organic material from the substrate at a rate of about 400-600 angstroms per minute.

41. A method for treating a surface of a substrate, comprising contacting the substrate with an aqueous solution comprising about 30-40% by volume hydrofluoric acid and about 60-70% by volume organic acid, based on the total volume of the composition, to remove substantially all dielectric and organic material from the surface of the substrate at a rate of about 50-1000 angstroms per minute to produce a hydrophobic, oxide-free surface.

42. A method for treating a surface of a substrate, comprising contacting the substrate with an aqueous solution comprising about 30-40% by volume hydrofluoric acid and about 60-70% by volume organic acid, based on the total volume of the composition, to remove substantially all dielectric and organic material from the surface of the substrate at a rate of about 400-600 angstroms per minute to produce a hydrophobic, oxide-free surface.

43. A method for treating a surface of a substrate, comprising applying an aqueous solution to the substrate to remove dielectric and organic material from the substrate at a rate of about 50-1000 angstroms per minute, the solution comprising about 30-40% by volume of an inorganic fluorine compound and about 60-70% by volume organic acid, based on the total volume of the composition.

44. A method for treating a surface of a substrate, comprising applying an aqueous solution to the substrate to remove dielectric and organic material from the substrate at a rate of about 400-600 angstroms per minute, the aqueous solution comprising about 30-40% by volume of an inorganic fluorine compound and about 60-70% by volume organic acid, based on the total volume of the composition.

45. A method for treating a surface of a substrate, comprising applying an aqueous solution to the substrate to remove dielectric and organic material from the substrate at a rate of about 50-1000 angstroms per minute, the aqueous solution comprising about 30-40% by volume of hydrofluoric acid and about 60-70% by volume organic acid, based on the total volume of the composition.

46. A method for treating a surface of a substrate, comprising applying the aqueous solution to the substrate to remove dielectric and organic material from the substrate at a rate of about 400-600 angstroms per minute, the aqueous solution comprising about 30-40% by volume of hydrofluoric acid and about 60-70% by volume organic acid, based on the total volume of the composition.

47. A method for treating a surface of a substrate, comprising applying the aqueous solution to the substrate to remove dielectric and organic material from the substrate at a rate of about 50-1000 angstroms per minute, the aqueous solution having a pH of about 3-4 and comprising about 30-40% by volume of hydrofluoric acid and about 60-70% by volume organic acid, based on the total volume of the composition.

48. A method for treating a surface of a substrate, comprising applying the aqueous solution to the substrate to remove dielectric and organic material from the substrate at a rate of about 400-600 angstroms per minute, the aqueous solution having a pH of about 3-4, and comprising about 30-40% by volume of hydrofluoric acid and about 60-70% by volume organic acid, based on the total volume of the composition.

49. A method for treating a surface of a substrate, comprising applying an aqueous solution to the substrate to remove substantially all dielectric and organic material from the surface of the substrate to produce a hydrophobic, oxide-free surface, the aqueous solution comprising about 30-40% by volume of an inorganic fluorine compound and about 60-70% by volume organic acid, based on the total volume of the composition, the amounts of the inorganic fluorine compound and organic acid in the aqueous solution effective to remove dielectric and organic material at a rate of about 50-1000 angstroms per minute.

50. A method for treating a surface of a substrate, comprising applying an aqueous solution to the substrate to remove at least a portion of the dielectric and organic material from the substrate, the aqueous solution comprising about 30-40% by volume of hydrofluoric acid and about 60-70% by volume organic acid, based on the total volume of the composition, the amounts of the hydrofluoric acid and organic acid in the aqueous solution effective to remove dielectric and organic material at a rate of about 50-1000 angstroms per minute.

51. A method for treating a surface of a substrate, comprising applying an aqueous solution to the substrate to remove at least a portion of the dielectric and organic material from the substrate, the aqueous solution comprising about 30-40% by volume of hydrofluoric acid and about 60-70% by volume organic acid, based on the total volume of the composition, the amounts of the hydrofluoric acid and organic acid in the aqueous solution effective to remove dielectric and organic material at a rate of about 400-600 angstroms per minute.

52. A post-etch cleaning method, comprising applying an aqueous solution to a wafer to remove substantially all dielectric and organic material from a surface of the wafer such that the surface of the wafer is rendered hydrophobic, the aqueous solution comprising an about 1:2 (v/v) ratio of an inorganic fluorine compound and an organic acid.

53. The post-etch cleaning method according to claim 52, wherein the removal of the dielectric and organic material is at a rate of about 50-1000 angstroms per minute.

54. The post-etch cleaning method according to claim 52, wherein the removal of the dielectric and organic material is at a rate of about 400-600 angstroms per minute.

55. The post-etch cleaning method according to claim 52, wherein the inorganic fluorine compound comprises about hydrofluoric acid.

56. A post-etch cleaning method, comprising applying an aqueous solution to a wafer to remove substantially all dielectric and organic material from a surface of the wafer such that the surface of the wafer is rendered hydrophobic, the aqueous solution comprising an about 1:2 (v/v) ratio of an hydrofluoric acid and an organic acid.

57. A post-etch cleaning method, comprising applying an aqueous solution to a wafer to remove substantially all dielectric and organic material from a surface of the wafer such that the surface of the wafer is rendered hydrophobic, the aqueous solution comprising about 30-40% by volume of an about 49% solution of hydrofluoric acid and about 60-70% by volume of an about 50% solution of organic acid, based on the total volume of the composition.

58. A method for treating a surface of a substrate, comprising applying an aqueous solution comprising an about 1:2 (v/v) ratio of an inorganic fluorine and an organic acid to remove substantially all dielectric and organic material from the substrate to provide an oxide-free surface.

59. A method for treating a surface of a substrate, comprising applying an aqueous solution comprising an about 1:2 (v/v) ratio of an inorganic fluorine and an organic acid to remove substantially all dielectric and organic material such that the surface of the substrate is rendered hydrophobic.

60. A method for treating a surface of a substrate, comprising applying an aqueous solution comprising about 30-40% by volume inorganic fluorine and about 60-70% by volume organic acid to remove dielectric and organic material from the substrate to provide an oxide-free surface.

61. A method for treating a surface of a substrate, comprising applying an aqueous solution comprising about 30-40% by volume inorganic fluorine and about 60-70% by volume organic acid to remove dielectric and organic material such that the surface of the substrate is rendered hydrophobic.

* * * * *

UNITED STATES PATENT AND TRADEMARK OFFICE
CERTIFICATE OF CORRECTION

PATENT NO. : 7,432,214 B2
APPLICATION NO. : 10/889280
DATED : October 7, 2008
INVENTOR(S) : Yates It is certified that error appears in the above-identified patent and that said Letters Patent is hereby corrected as shown below:

On the Title page, in field (54), in "Title", in column 1, line 2, delete "FILM," and insert -- FILMS, --, therefor.

In column 1, line 2, delete "FILM," and insert -- FILMS, --, therefor.

In column 9, line 58, in Claim 2, delete "is" and insert -- are --, therefor.

In column 10, line 5, in Claim 5, delete "a least" and insert -- at least --, therefor.

In column 10, line 11, in Claim 6, after "comprising" insert -- : --.

In column 11, line 19, in Claim 21, delete "low k" and insert -- low-k --, therefor.

In column 11, line 23, in Claim 23, delete "(v1v)" and insert -- (v/v) --, therefor.

In column 11, line 35, in Claim 25, delete "(v1v)" and insert -- (v/v) --, therefor.

In column 11, line 49, in Claim 27, delete "50-000" and insert -- 50-1000 --, therefor.

In column 11, line 64, in Claim 30, delete "(v1v)" and insert -- (v/v) --, therefor.

In column 12, line 9, in Claim 32, delete "(v1v)" and insert -- (v/v) --, therefor.

Signed and Sealed this

Seventeenth Day of March, 2009

JOHN DOLL
*Acting Director of the United States Patent and Trademark Office*